US012609688B2

(12) United States Patent
Ojima et al.

(10) Patent No.: US 12,609,688 B2
(45) Date of Patent: Apr. 21, 2026

(54) BACKGROUND DUTY CYCLE CORRECTION IN UNSELECTED DIE

(71) Applicant: Sandisk Technologies, Inc., Milpitas, CA (US)

(72) Inventors: Naoki Ojima, Fujisawa (JP); Masahiro Kano, Yokohama (JP)

(73) Assignee: Sandisk Technologies, Inc., Milpitas, CA (US)

( * ) Notice: Subject to any disclaimer, the term of this patent is extended or adjusted under 35 U.S.C. 154(b) by 43 days.

(21) Appl. No.: 18/673,786

(22) Filed: May 24, 2024

(65) Prior Publication Data

US 2025/0364980 A1      Nov. 27, 2025

(51) Int. Cl.
H03K 5/156       (2006.01)
G06F 3/06        (2006.01)
G11C 16/04       (2006.01)
G11C 16/32       (2006.01)

(52) U.S. Cl.
CPC ......... H03K 5/1565 (2013.01); G06F 3/0613 (2013.01); G06F 3/0659 (2013.01); G06F 3/0679 (2013.01); G11C 16/32 (2013.01); G11C 16/0483 (2013.01)

(58) Field of Classification Search
CPC ... H03K 5/1565; G06F 3/0613; G06F 3/0659; G06F 3/0679; G06F 13/4234; G06F 13/1689; G06F 13/32; G11C 16/32; G11C 16/0483
See application file for complete search history.

(56) References Cited

U.S. PATENT DOCUMENTS

| | | | |
|---|---|---|---|
| 6,285,226 B1 | 9/2001 | Nguyen | |
| 10,218,343 B1 | 2/2019 | Tomar et al. | |
| 11,082,036 B2 | 8/2021 | Marko et al. | |
| 2014/0103981 A1* | 4/2014 | Choi | H03K 21/38 |
| | | | 327/175 |
| 2020/0177172 A1* | 6/2020 | Satoh | H03L 7/18 |
| 2020/0185044 A1* | 6/2020 | Takada | G11C 29/023 |
| 2022/0076738 A1* | 3/2022 | Bazarsky | G11C 11/5628 |
| 2023/0118731 A1* | 4/2023 | Balasubrahmanyam | |
| | | | H03K 3/017 |
| | | | 365/185.17 |

OTHER PUBLICATIONS

Jedec, "Jedec Standard—NAND Flash Interface Interoperability," Rev. JESD230D, Jun. 2019, 78 pages.

* cited by examiner

*Primary Examiner* — Curtis James Kortman
(74) *Attorney, Agent, or Firm* — Pearl Cohen Zedek Latzer Baratz LLP

(57)      ABSTRACT

An apparatus includes a control circuit in a first memory package. The control circuit is configured to connect to a bus and to receive a Duty Cycle Correction (DCC) training command over the bus. The control circuit is configured to perform a DCC training operation while the first memory package is unselected and while a second memory package connected to the bus is selected to perform a memory access operation.

18 Claims, 15 Drawing Sheets

Figure 5A
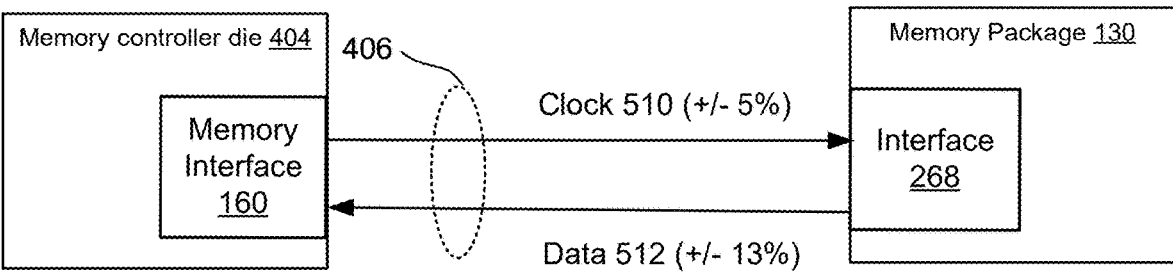
Figure 5B
Figure 5C
Figure 5D
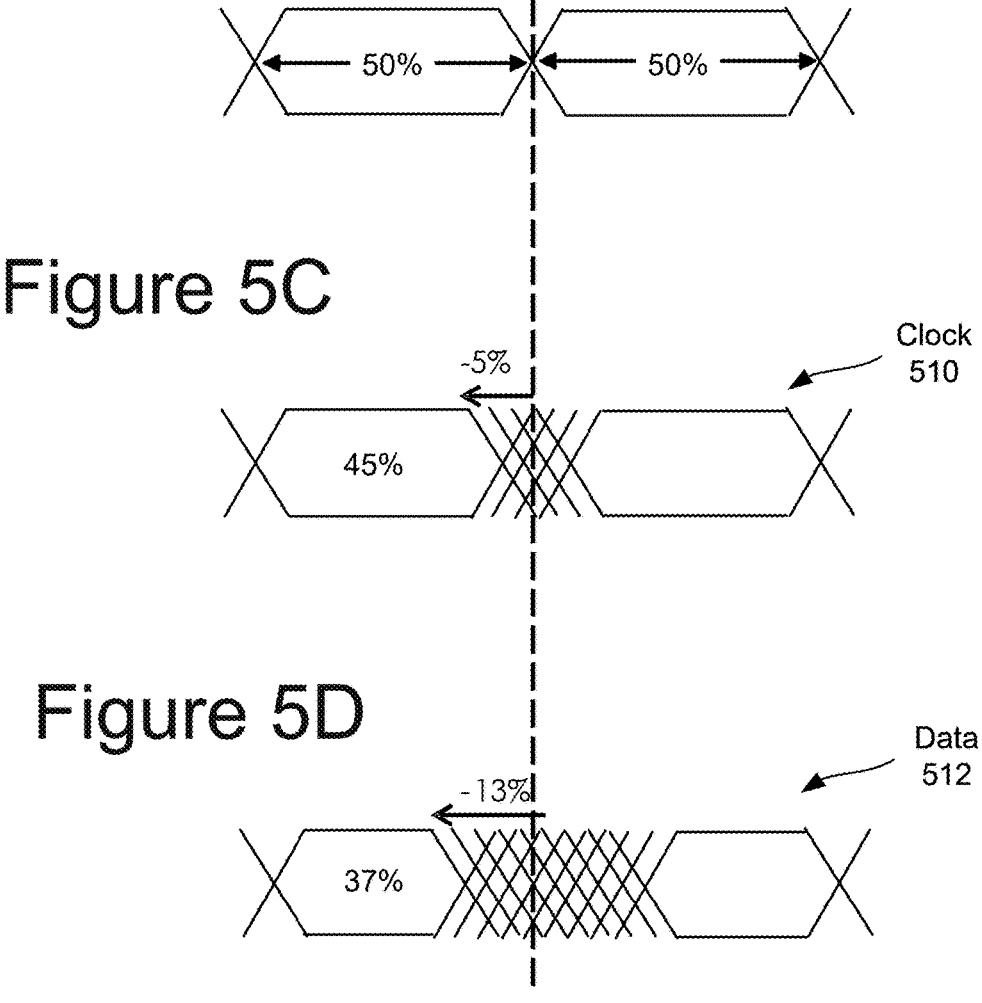

622

DC < 50%

DCC
620

DC = 50%

624

626

DC > 50%

DCC
620

DC = 50%

624

Quick DCC

1020

Obtain first x bits of n-bit DCC code from previous DCC training

1022

Perform search for remaining n-x bits of code

Figure 12

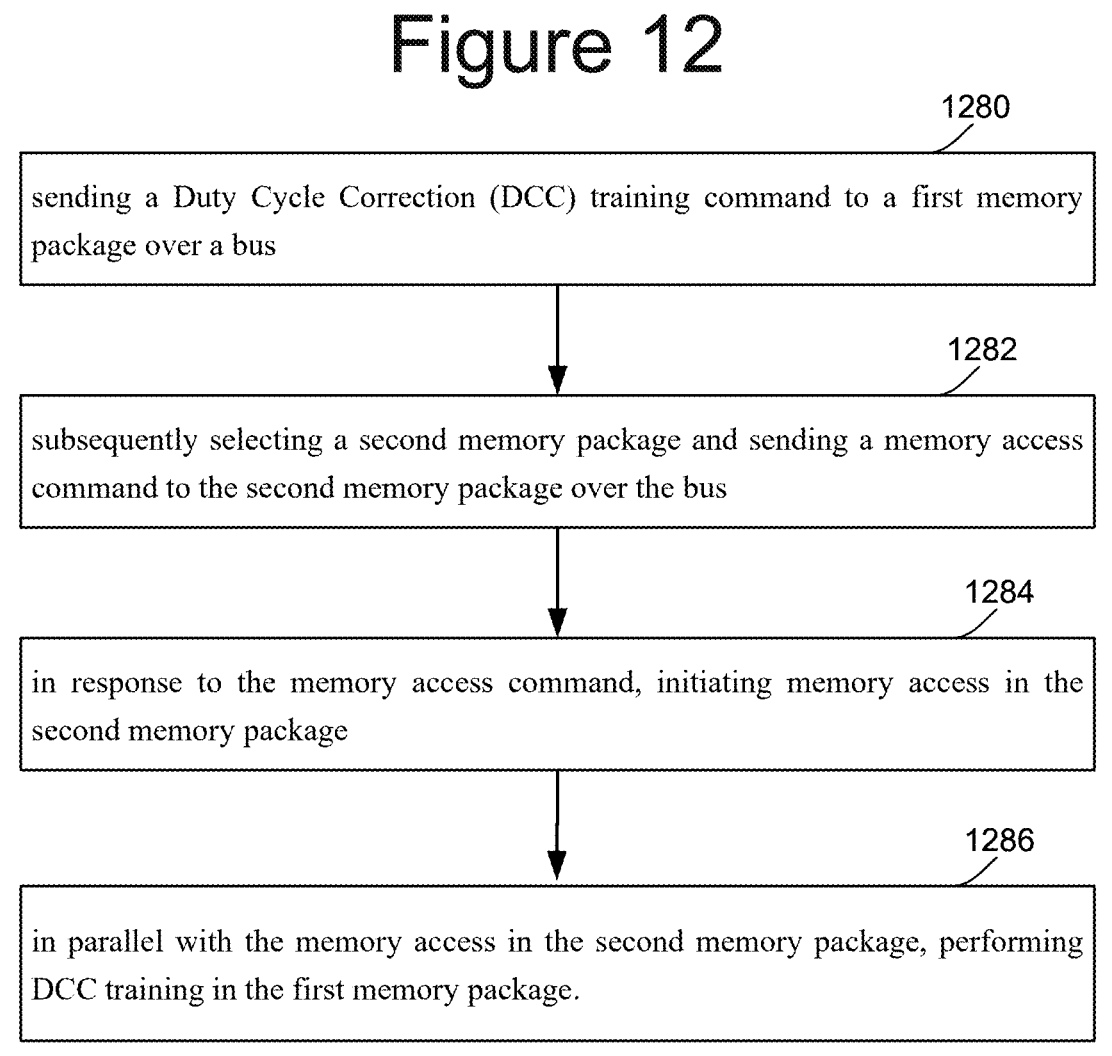

1280 sending a Duty Cycle Correction (DCC) training command to a first memory package over a bus

1282 subsequently selecting a second memory package and sending a memory access command to the second memory package over the bus

1284 in response to the memory access command, initiating memory access in the second memory package

1286 in parallel with the memory access in the second memory package, performing DCC training in the first memory package.

BACKGROUND DUTY CYCLE CORRECTION IN UNSELECTED DIE

BACKGROUND

The present technology relates to nonvolatile memories.

Semiconductor memory devices have become more popular for use in various electronic devices. For example, non-volatile semiconductor memory is used in cellular telephones, digital cameras, personal digital assistants, mobile computing devices, non-mobile computing devices and other devices (host devices).

A memory device includes memory cells, which may be arranged in series, in NAND strings, for instance, where select gate transistors are provided at the ends of the NAND string to selectively connect a channel of the NAND string to a source line or bit line. A charge-storing material such as a floating gate or a charge-trapping material can be used in such memory devices to store a charge which represents a data state.

A data storage system may include a memory controller die and one or more memory package. A memory package may include one or more nonvolatile memory die. A bus between the memory controller and memory packages may allow data to be transferred to memory packages for storage and from memory packages for subsequent access. Communication between the memory controller and memory packages may be impacted by variation in duty cycle. A Duty Cycle Correction (DCC) circuit may correct duty cycle (e.g., provide a signal with a duty cycle at or near 50%).

BRIEF DESCRIPTION OF THE DRAWINGS

Like-numbered elements refer to common components in the different Figures (Figs).

FIGS. 5A-D show examples of a bus with duty cycle variation.

FIG. 12 illustrates a method that includes performing DCC training in a memory package in parallel with memory access in another memory package.

DETAILED DESCRIPTION

The technology described herein includes control circuits that are configured to perform DCC training in a data storage system in a manner that allows other operations (e.g., memory access operations such as read and write) to be performed in parallel. For example, where multiple memory packages (each including one or more memory die) are connected to a memory controller by a bus, one or more memory packages (e.g., one or more memory die in a memory package) may perform DCC training while another memory package (e.g., one or more die in another memory package) may perform a memory access operation. A clock signal on the bus may be used for both memory access by the selected memory package (e.g., a read clock used for a read operation) and also for DCC training by one or more unselected memory package.

DCC may be implemented by applying a suitable time offset to a signal. A suitable time offset may be obtained from a search of a list of possible time offsets. In a DCC training operation (e.g., an initial DCC training operation after power on) searching a list may proceed using a binary search of the entire list. In another DCC training operation (e.g., subsequent to the initial DCC training operation) searching may use a time offset that was previously found (e.g., in the initial DCC training operation) and may limit binary searching to a subset of entries in the list. For example, binary searching may be limited to the least significant bits of a corresponding code while the most significant bits are obtained from a previous DCC training.

Aspects of the present technology provide technical solutions to technical problems associated with efficiently providing DCC in a data storage system. Technical solutions include technology to enable DCC training to be carried out as a background operation that does not interrupt or delay other operations of the data storage system (e.g., does not impact read data throughput).

Figure 1A:
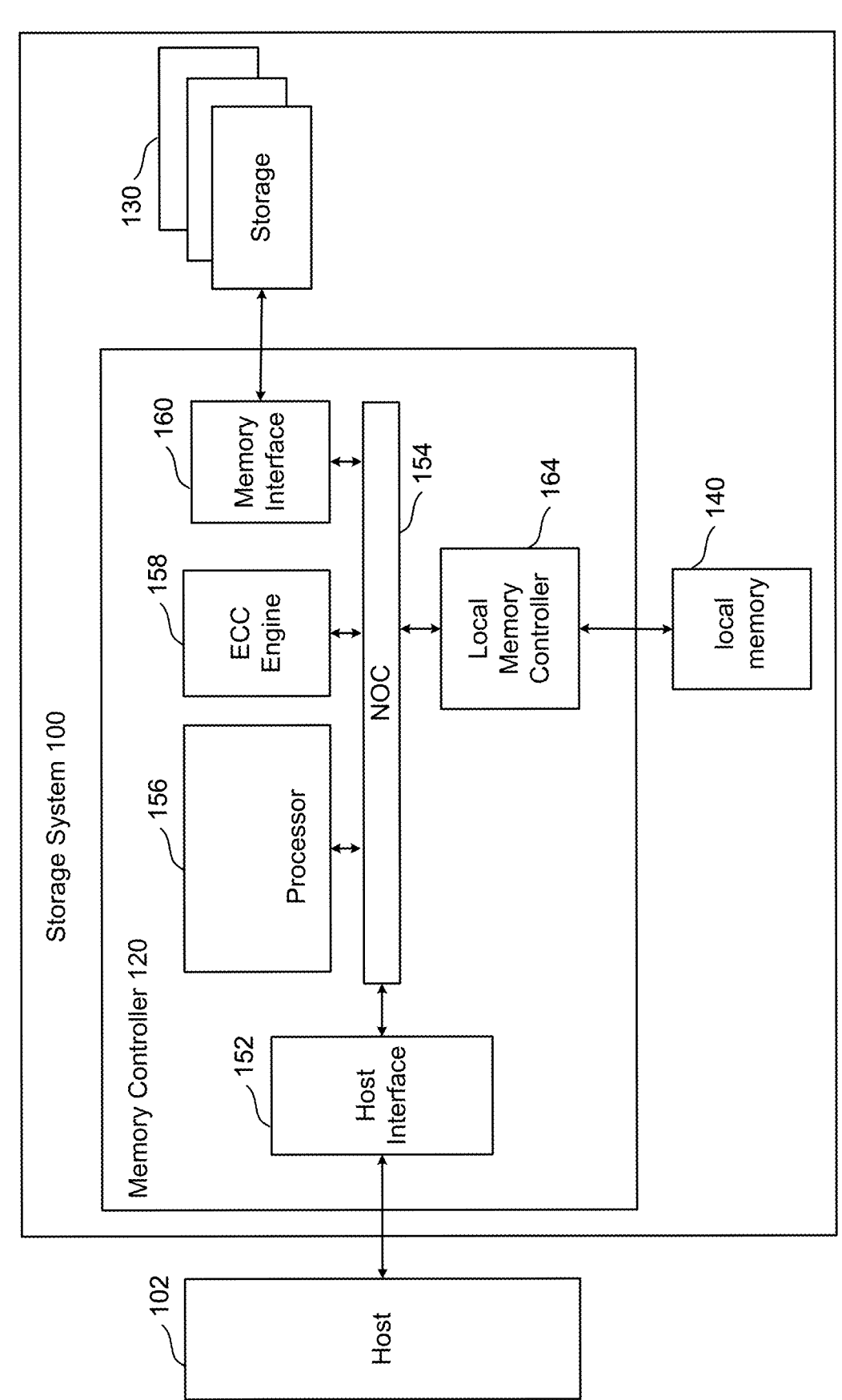
FIG. 1A is a block diagram of one embodiment of a storage system connected to a host.

FIG. 1A is a block diagram of one embodiment of a data storage system 100 that implements the technology described herein. In one embodiment, storage system 100 is a solid state drive ("SSD"). Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1A are electrical circuits. Storage system 100 includes a memory controller 120 (or storage controller) connected to memory package 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus.

Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure.

Memory interface 160 communicates with memory packages 130. In one embodiment, memory interface provides a Toggle Mode interface. Other interfaces can also be used. In some example implementations, memory interface 160 (or another portion of memory controller 120) implements a scheduler and buffer for transmitting data to and receiving data from one or more memory die.

Figure 1B:
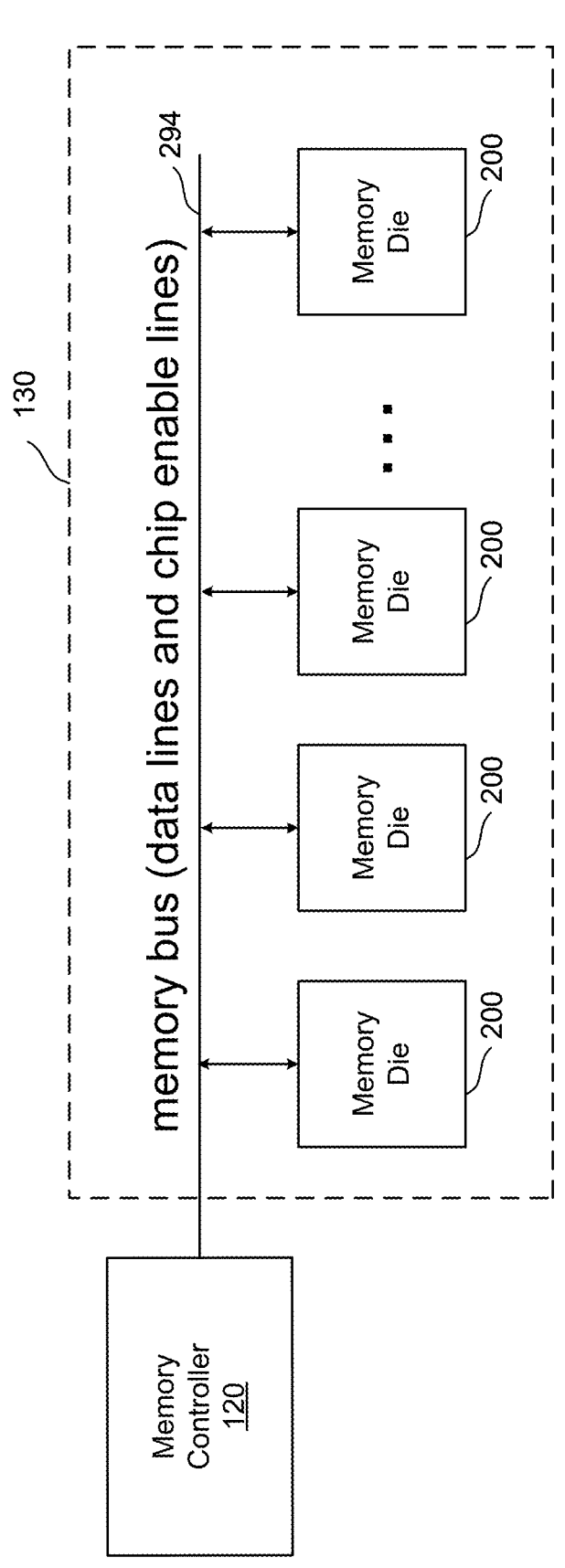
FIG. 1B is a block diagram of one embodiment of a memory package.

FIG. 1B is a block diagram of one embodiment of a memory package 130 that includes a plurality of memory die 200 connected to a memory bus 294 (data lines and chip enable lines). The memory bus 294 connects to the memory interface of a memory controller 120 (e.g., memory interface

160). In some embodiments, the memory package can include a small controller connected to the memory bus. The memory package can have one or more memory die. In one embodiment, each memory package includes eight or 16 memory die; however, other numbers of memory die can also be implemented. The technology described herein is not limited to any particular number of memory die. In some cases, a TM interface may be implemented in a memory die (e.g., one or more of memory dies 200). In some cases, a TM interface may be implemented in a control die that is coupled to (e.g., directly bonded to) a memory die. The present technology is not limited to any particular type of interface (TM or other such interface) or to any location (e.g., memory die, controller die, or other location).

Figure 2A:
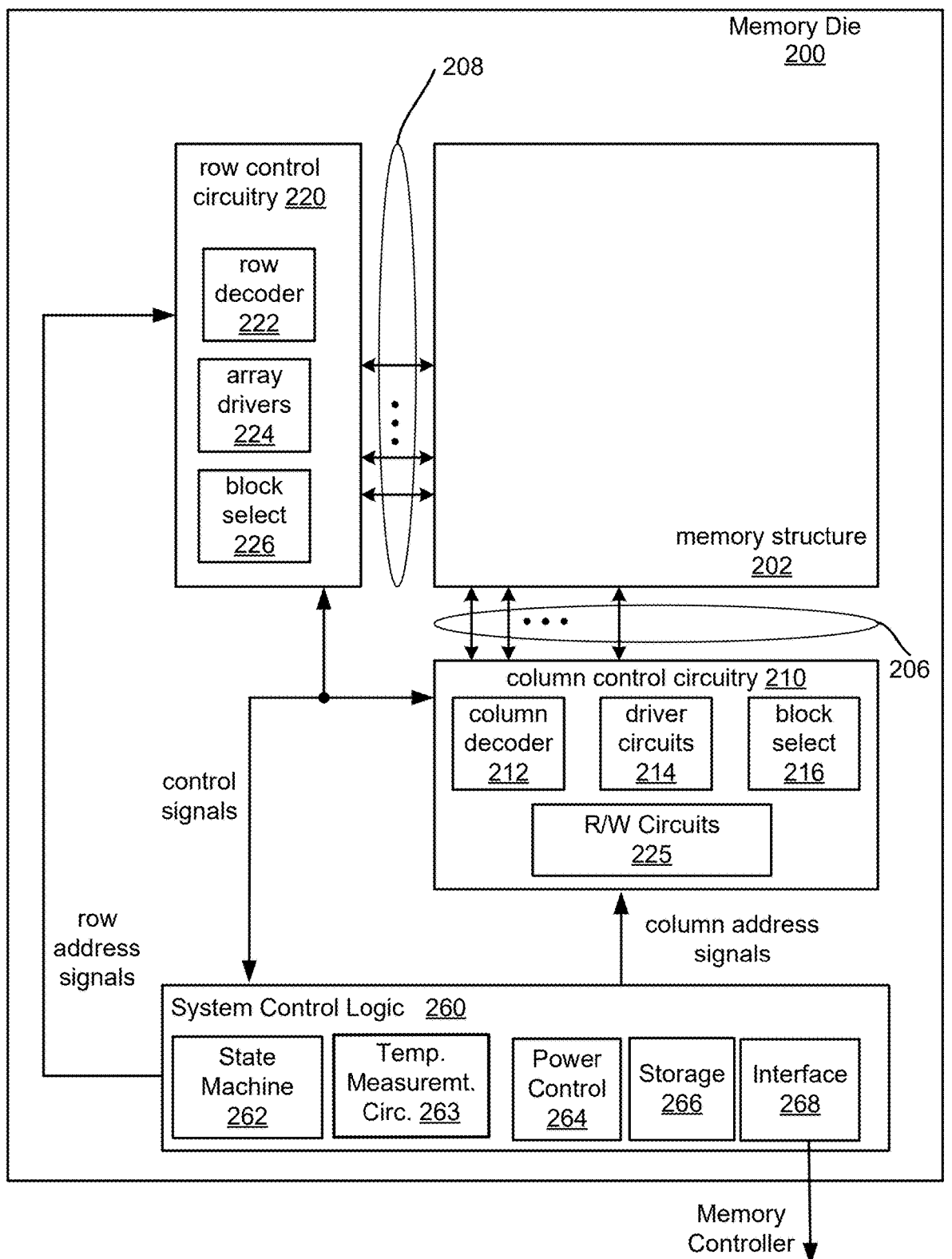
FIG. 2A is a functional block diagram of an embodiment of a memory die.

In one embodiment, a memory package 130 comprises one or more memory dies. FIG. 2A is a functional block diagram of one embodiment of a memory die 200 that comprises non-volatile storage. Each of the one or more memory dies of memory package 130 can be implemented as memory die 200 of FIG. 2A. The components depicted in FIG. 2A are electrical circuits. Memory die 200 includes a memory structure 202 (e.g., memory array) that can comprise non-volatile memory cells (also referred to as non-volatile storage cells), as described in more detail below. The array terminal lines of memory structure 202 include the various layer(s) of word lines organized as rows, and the various layer(s) of bit lines organized as columns. However, other orientations can also be implemented. Memory die 200 includes row control circuitry 220, whose outputs are connected to respective word lines of the memory structure 202. Row control circuitry 220 receives a group of M row address signals and one or more various control signals from System Control Logic 260, and typically may include such circuits as row decoders 222, array drivers 224, and block select circuit 226 for both reading and writing (programming) operations. Row control circuitry 220 may also include read/write circuitry. Memory die 200 also includes column control circuitry 210 including read/write circuits 225. The read/write circuits 225 may contain sense amplifiers and data latches. The sense amplifier(s) input/outputs are connected to respective bit lines of the memory structure 202. Although only a single block is shown for memory structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuit 216, as well as read/write circuitry, and I/O multiplexers.

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations. System control logic 260 includes storage 266 (e.g., RAM, registers, latches, etc.), which may be used to store parameters for operating the memory structure 202. Temperature measurement circuit 263 may generate temperature measurement values from temperature sensing by one or more temperature transducers located in memory die 200.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies. Three-dimensional NAND structures (see, for example, FIG. 3) in particular may benefit from specialized processing operations.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
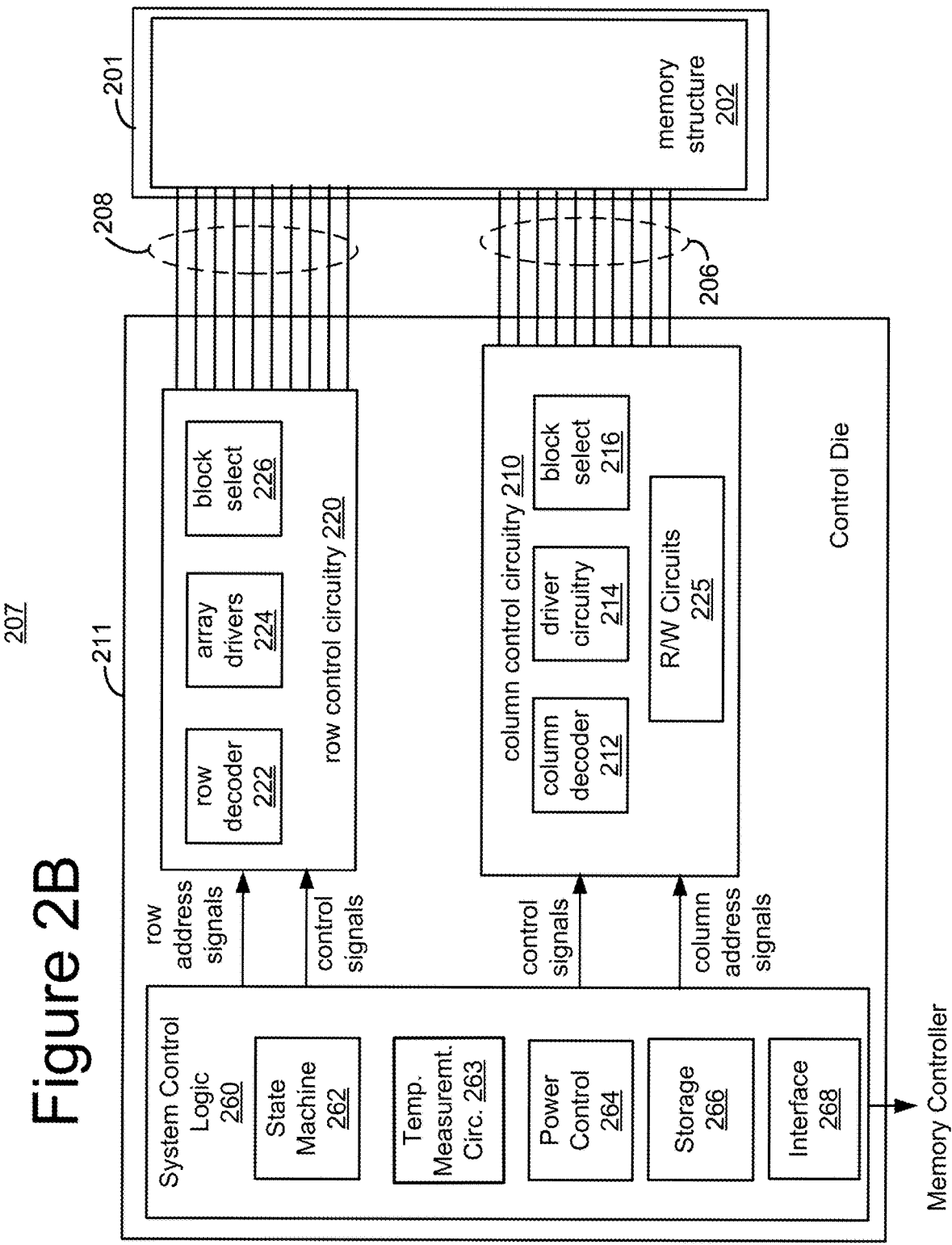
FIG. 2B is a functional block diagram of an embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement memory package 130 of storage system 100. The integrated memory assembly 207 includes two types of semiconductor dies (or more succinctly, "die"). Memory structure die 201 includes memory structure 202. Memory structure 202 includes nonvolatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate memory controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including read/write circuits 225 on the control die 211 coupled to memory structure 202 on the memory structure die 201 through electrical paths 206. For example, electrical paths 206 may provide electrical connection between column decoder 212, driver circuits 214, and block select circuit 216 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select circuit 226 are coupled to memory structure 202 through electrical paths 208. Each of electrical path 208 may correspond to a word line, dummy word line, or select gate line. Additional electrical paths may also be provided between control die 211 and memory structure die 201.

For purposes of this document, the phrases "a control circuit" or "one or more control circuits" can include any one of or any combination of memory controller 120, state machine 262, power control module 264, all or a portion of system control logic 260, all or a portion of row control circuitry 220, all or a portion of column control circuitry 210, read/write circuits 225, sense amps, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, storage system 100, memory controller 120, memory package 130, memory die 200, integrated memory assembly 207, and/or control die 211.

Figure 3:
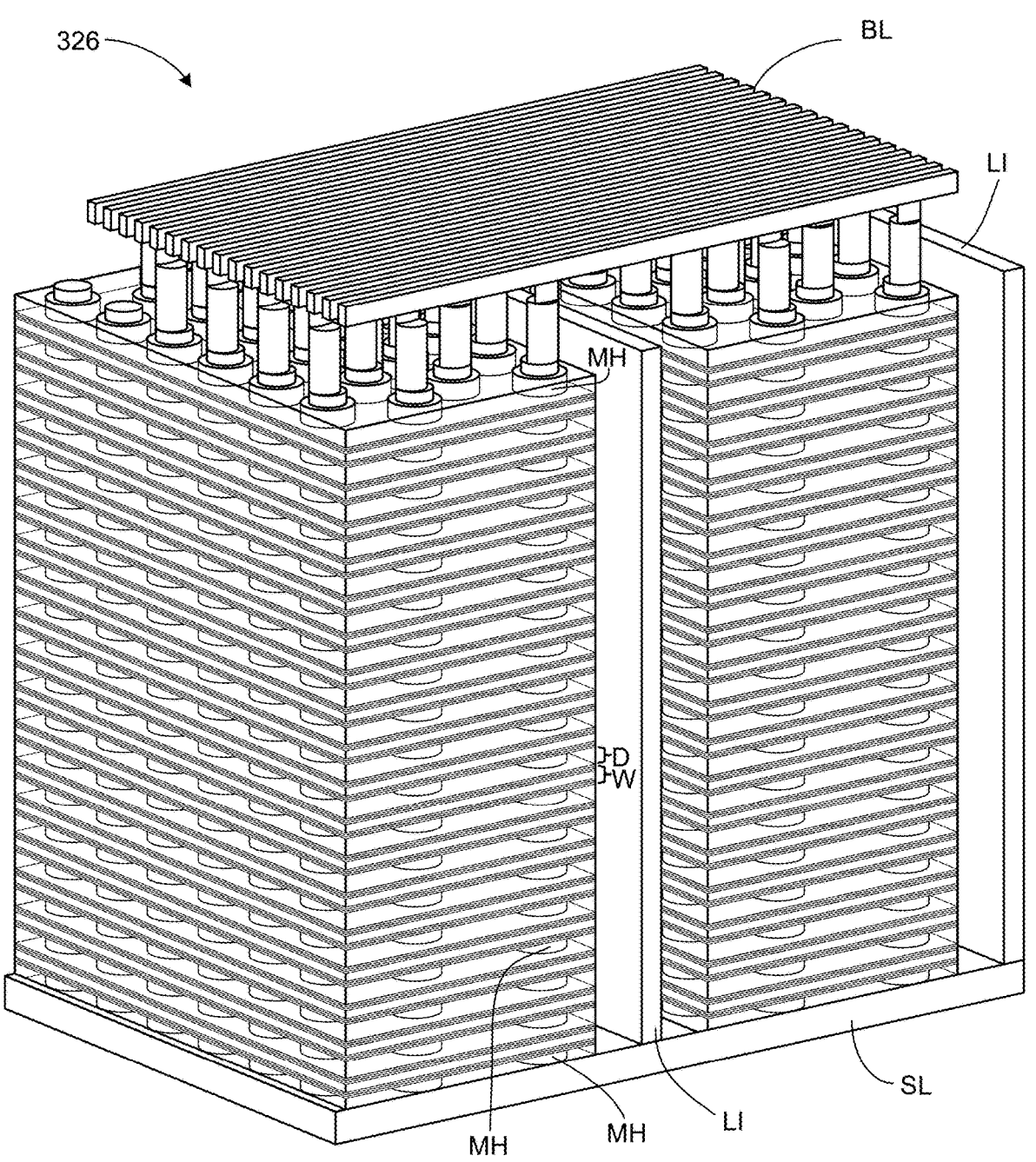
FIG. 3 is a perspective view of a portion of one embodiment of a monolithic three-dimensional memory structure.

FIG. 3 is a perspective view of a portion of one example embodiment of a monolithic three-dimensional nonvolatile memory array that can comprise memory structure 202, which includes a plurality memory cells. For example, FIG. 3 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-278 alternating dielectric layers and conductive layers, for example, 127 data word line layers, 8 select layers, 4 dummy word line layers and 139 dielectric layers. More or fewer than 108-278 layers can also be used.

The alternating dielectric layers and conductive layers are divided into four "fingers" by local interconnects LI. FIG. 3 shows two fingers and two local interconnects LI. Below the alternating dielectric layers and word line layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data.

Figure 4:
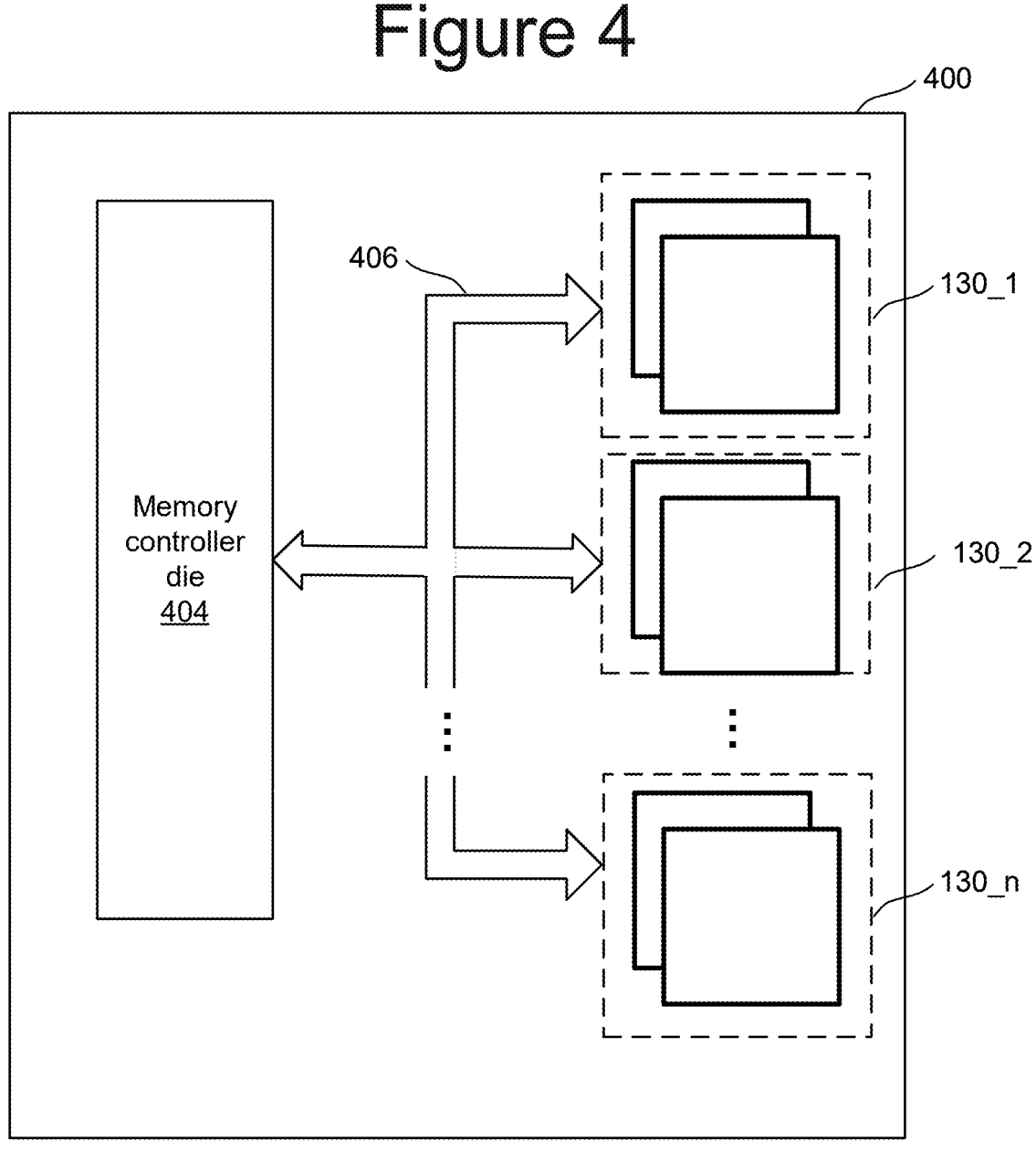
FIG. 4 shows an example of a data storage system that includes a memory controller die connected to memory packages.

FIG. 4 shows an example of a data storage system 400 that includes a memory controller die 404 (e.g., memory controller 120 formed on memory controller die 404) connected to n memory packages 130_1 to 130_n (where n may be any number) by a bus 406. Each memory package 130 may include one or more memory die (e.g., a single memory die 200 as illustrated in FIG. 2A or multiple memory dies, for example, stacked or otherwise arranged) or may include one or more integrated memory assembly (e.g., integrated memory assembly 207, including control die 211 and memory structure die 201). Bus 406 connects memory controller die 404 with memory packages 130 to enable transfer of data from memory controller die 404 to a selected memory package 130 (e.g., data to be written in nonvolatile memory, which may be referred to as write data or DIN) and to enable transfer of data from a selected memory package 130 to memory controller die 404 (e.g., data read from nonvolatile memory, which may be referred to as read data or DOUT). In an example, only one memory package 130 may be selected at any time. Other memory packages 130 are unselected at this time so that communication over bus 406 is only between memory controller die 404 and a selected memory package at a given time. Memory controller die 404 may select different memory packages at different times to enable memory access operations (read and write operations) directed to different memory packages.

Communication over bus 406 may be digital communication that uses data signals (e.g., DQ) and clock signals (e.g., DQS), which may follow an interface protocol (e.g., TM800). High speed digital communication over such a bus may be challenging for a number of reasons. For example, duty cycle variation may cause errors (e.g., a high Bit Error Rate or "BER") at a receiving side of such a bus. While duty cycle may nominally be set to 50%, duty cycle of a signal received from a bus in a data storage system may deviate significantly from 50%, which may result in a high BER. In some cases, Duty Cycle Correction (DCC) circuits may be provided to detect and correct duty cycle of a signal (e.g., to correct a signal so that duty cycle is at or near 50%).

FIGS. 5A-D illustrate examples of duty cycle variation that may occur in a data storage system (e.g., data storage system 400), which may cause significant errors. FIG. 5A shows an example of memory controller die 404 in communication with a memory package 130 over bus 406. Memory interface 160 of memory controller die 404 sends a clock signal 510 (e.g., a read enable or RE signal) over bus 406. Interface 268 of memory package 130 receives the clock signal and uses it to return read data 512 over bus 406. In the example of FIG. 5A, clock signal 510 has a range of 50%+/−5% (e.g., from 45% to 55%). Additional duty cycle variation may occur in memory package 130 (e.g., caused by complex high speed circuits of interface 268 and/or local variations), which may introduce an additional variation of +/−8%. As a result, data signal 512 may have a duty cycle that deviates from 50% by up to 13% (e.g., duty cycle between 37% and 63%).

FIG. 5B shows duty cycle of 50%, which may be the nominal duty cycle for clock signal 510. FIG. 5C shows duty cycle of 45% resulting from variation in clock signal 510 (e.g., −5% from nominal duty cycle). For example, clock signal 510 of FIG. 5C may be a clock signal received by interface 268. FIG. 5D shows an example of data signal 512 that may be generated by interface 268. Data signal 512 shows a duty cycle of 37% resulting from the deviation of −8% from interface 268 in addition to deviation of −5% from clock signal 510. The resulting 37% duty cycle may impact error rates in data received by memory interface 160 (e.g., high BER).

In some cases, a Duty Cycle Correction (DCC) circuit may be used to correct duty cycle of a signal (e.g., clock signal, data signal or other digital signal) that may be sent on a bus such as bus 406. Correction of duty cycle may include receiving an uncorrected signal that has a duty cycle that may deviate significantly from 50% and generating a corrected signal from the uncorrected signal where the corrected signal has a duty cycle equal or substantially equal to 50% (e.g., 50%+/−X % where X may be, for example, 1, 2, 5, 10 or some other value). For example, a DCC circuit may be provided in interface 268 and/or memory interface 160 to ensure that duty cycle is maintained within an acceptable range (e.g., to ensure duty cycle is at or near 50% as shown in FIG. 5B and not 37% as shown in FIG. 5D).

Figure 6A:
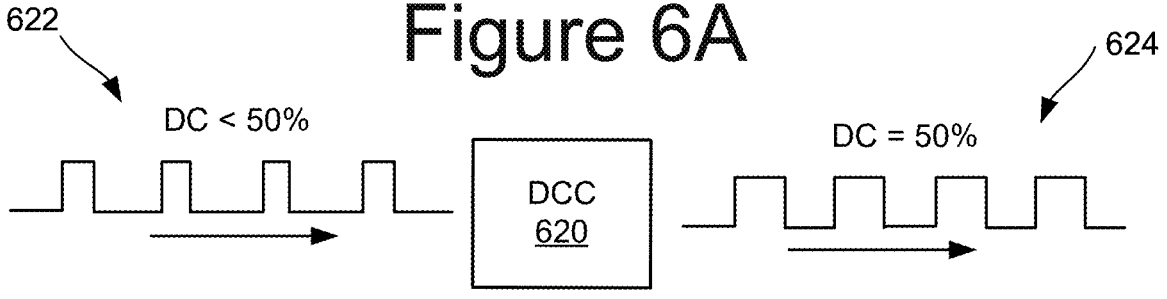
FIGS. 6A-B illustrate an example of a Duty Cycle Correction (DCC) circuit.
Figure 6B:
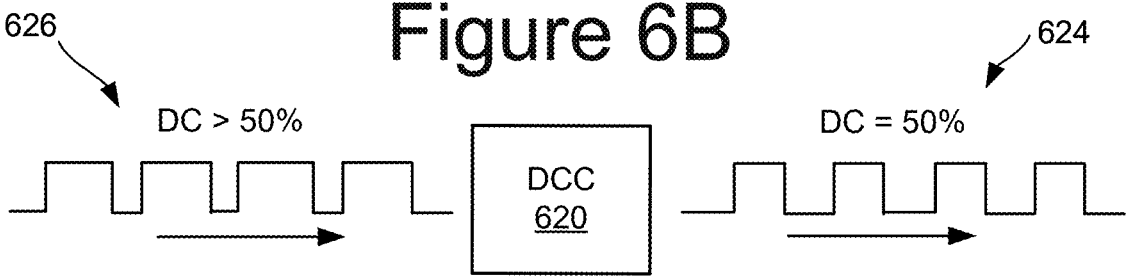

FIGS. 6A-B show an example of a DCC circuit 620, which may be provided on one or both sides of a bus such as bus 408 (e.g., DCC circuit 620 may be in interface 268).

FIG. 6A shows an example in which DCC circuit 620 receives uncorrected signal 622, which has a duty cycle less than 50% (e.g., 37% as shown in FIG. 5D). DCC circuit 620 performs duty cycle correction to generate corrected signal 624 from uncorrected signal 622. Corrected signal 624 has a duty cycle that is substantially equal to 50% (e.g., 50%+/−X %, where X is, for example, less than ten). For example, DCC circuit 620 may apply an appropriate delay to a falling edge of signal 622 to generate signal 624.

FIG. 6B shows an example in which DCC circuit 620 receives uncorrected signal 626, which has a duty cycle greater than 50% (e.g., 63%). DCC circuit 620 performs duty cycle correction to generate corrected signal 624 from uncorrected signal 626. Corrected signal 624 has a duty cycle that is substantially equal to 50%. For example, DCC circuit 620 may apply an appropriate time offset to a falling edge of signal 622 to generate signal 624.

Figure 7A:
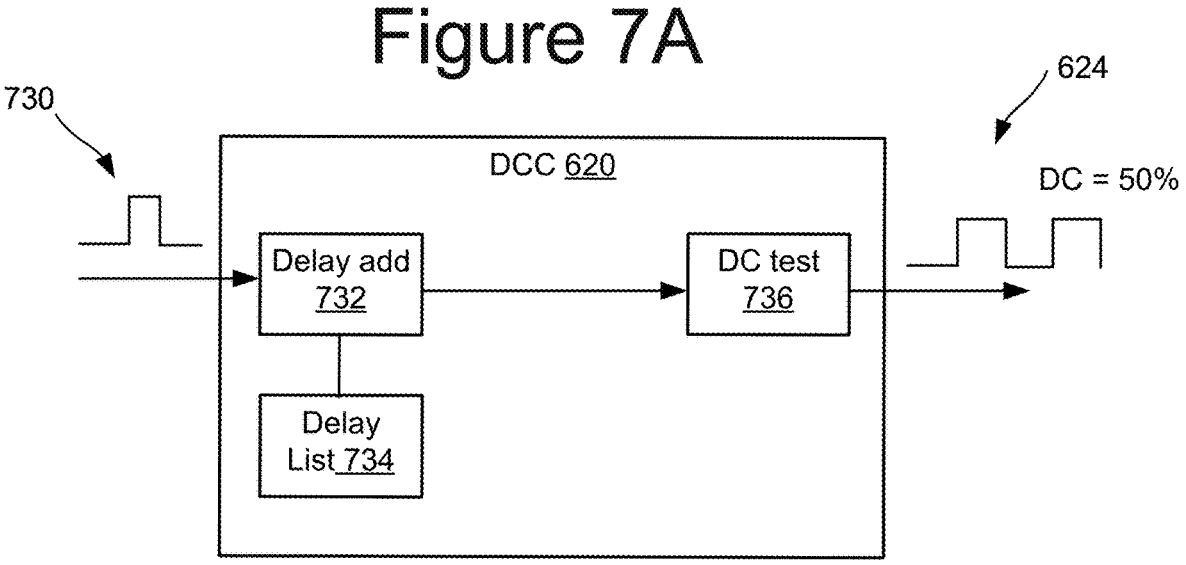
FIGS. 7A-C illustrate operation of a DCC circuit.

FIG. 7A shows an example implementation of DCC circuit 620, which receives an uncorrected signal 730 (e.g., signal with duty cycle that is significantly different from 50%, such as more than 60% or less than 40%) and generates a corrected signal 624 with duty cycle substantially equal to 50% (e.g., between 60% and 40%, between 55% and 45% or some other appropriate range). DCC circuit 620 includes a delay add circuit 732, which may add a delay (time offset) to signal 730 to change pulse width and thereby change duty cycle. Delay add circuit 732 is connected to delay list 734, which may contain a list of delays that can be applied by DCC circuit 620 to correct duty cycle. Delays (time offsets) may be positive or negative so that pulse width may be widened or narrowed to increase or decrease duty cycle. Delay add circuit 732 is also connected to duty cycle test circuit 736, which may test duty cycle of a signal output by delay add circuit 732. For example, delay add circuit 732 may apply different delays from delay list 734 and the resulting signals may be sent to duty cycle test circuit 736 to determine if the signal is at or near 50% (e.g., in a DCC training operation). When a delay from delay list is added by delay add circuit 732 to produce a duty cycle at or near 50% as confirmed by duty cycle test circuit 736, the delay is recorded and subsequently applied to uncorrected signal 730 to generate corrected signal 624, which is output by DCC circuit 620.

Figure 7B:
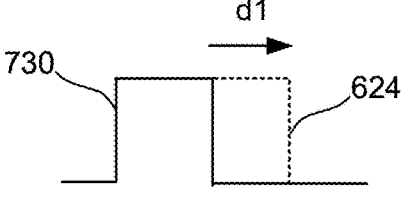
Figure 7C:
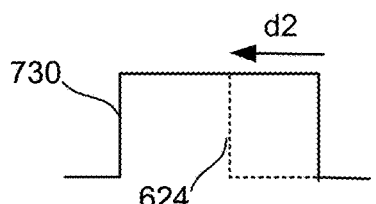

FIG. 7B shows an example of a delay, d1, added to uncorrected signal 730 to obtain corrected signal 624 (shown by dotted line). For example, the falling edge of signal 730 is delayed by d1 (e.g., to increase pulse width). FIG. 7C shows an example of a negative delay, d2, which is added to uncorrected signal 730 to obtain corrected signal 624 (shown by dotted line). For example, a falling edge of uncorrected signal 730 may be subject to a negative delay, d2, to cause the falling edge to occur earlier (e.g., to decrease pulse width). While FIGS. 7A-C show an example of DCC correction circuits, the present technology may be implemented by a wide range of DCC correction circuits and is not limited to any particular structure.

In an example of a DCC training operation in a storage system, a memory package (e.g., memory die, dies or integrated memory assembly) may be selected and a read operation may be performed in the memory package to read and transfer data, which is used to obtain an appropriate delay that results in a corrected signal with duty cycle at or near 50% (e.g., between 49% and 51%).

Figure 8A:
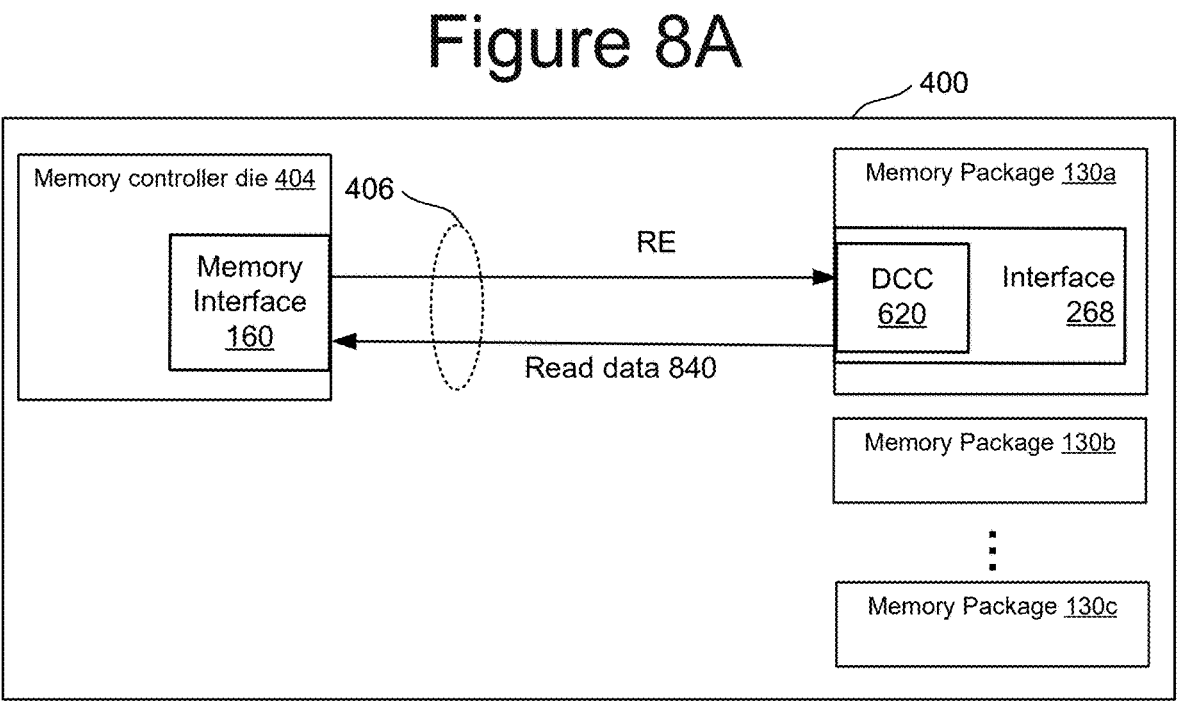
FIGS. 8A-B illustrate an example of a DCC training operation.
Figure 8B:
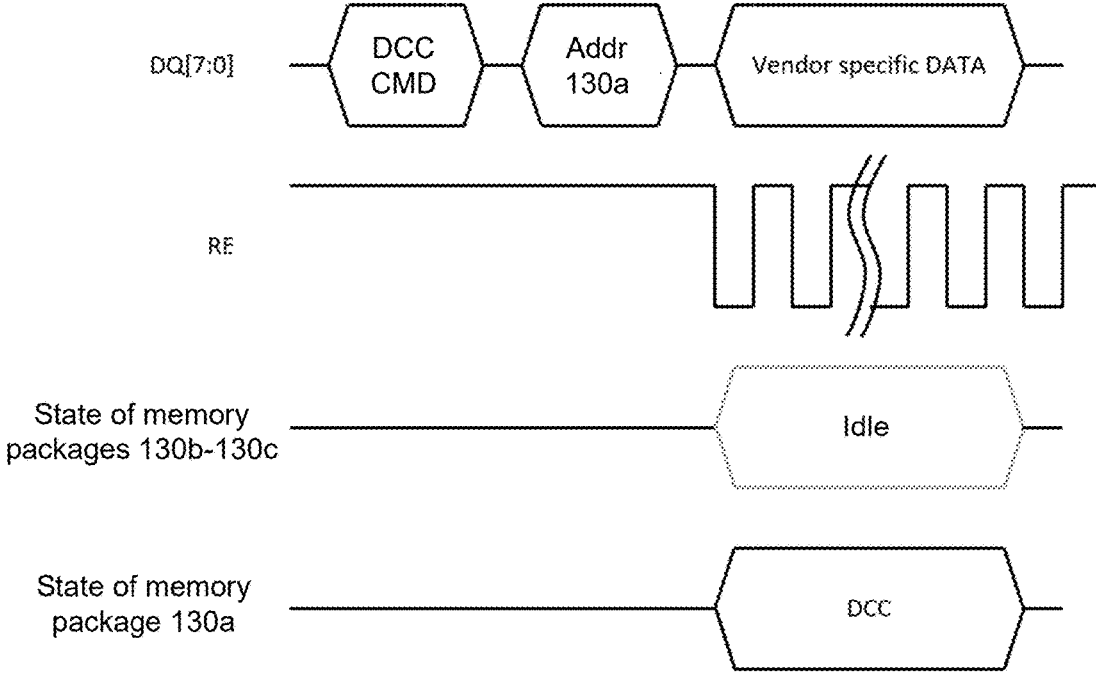

FIG. 8A-B show an example of data storage system 400 in which DCC circuits are provided to enable DCC training operations to obtain an appropriate correction factor or delay to correct duty cycle of a signal. In the example of FIG. 8A, memory package 130a is selected while other memory packages 130b-130c are unselected. In a DCC operation, clock signal, RE (read enable), is provided from memory interface 160 via bus 406 to memory package 130a and read data 840 is sent from memory package 130a to memory interface 160. For example, in some examples, a 16 kB read of data from memory package 130a may be performed and the resulting data transferred over bus 406 as part of a DCC training operation. While the DCC training operation is ongoing, bus 406 is busy with read data 840 and unselected memory packages 130b-130c are idle.

FIG. 8B further illustrates the example of FIG. 8A and includes a DCC training command (DCC CMD sent over bus 406 (DQ[7:0] corresponds to data/command lines of bus 406) with an address in memory package 130a (Addr 130a), which causes selection of memory package 130a. Subsequently, vendor specific DATA is read from memory package 130a. Clock signal RE (read enable) is also shown as providing a read clock for transfer of data from the address specified over bus 406. FIG. 8B also shows the state of memory package 130a (performing DCC training "DCC") while memory packages 130b-130c remain idle.

In some cases, the time to perform DCC training as illustrated in FIGS. 8A-B may be significant and may impact other operations. For example, while DCC training is performed on memory package 130a as shown, memory package 130a is unavailable to perform other operations. Furthermore, other memory packages 130b-130c are idle and are not available to perform other operations. For example, memory access (read and write) operations may be delayed while DCC training is performed.

Aspects of the present technology are directed to efficient ways to perform DCC training that, for example, may reduce the impact of DCC training on other operations. In an example, a relatively quick DCC training operation may be performed by one or more memory package or memory die that is/are unselected while a selected die performs data-out (e.g., while a bus is transferring data from a selected die) as further described below. Such a DCC training operation may be performed in parallel with other operations directed to other memory packages to reduce the impact of DCC training. A quick DCC training may not require reading and transferring large amounts of data (e.g., 16 kB required by some DCC training operations). In some cases, an extended DCC training operation (e.g., as illustrated in FIGS. 8A-B) may be performed at a first time (e.g., during an initialization operation when powering on) and subsequently, at a second time, one or more quick DCC training operations may be performed to maintain duty cycle within an acceptable range. Data bytes transferred at data-out are not limited to 16 KB (e.g., a quick DCC training can be done with less than 16 kB of data-out bytes.

Figure 9A:
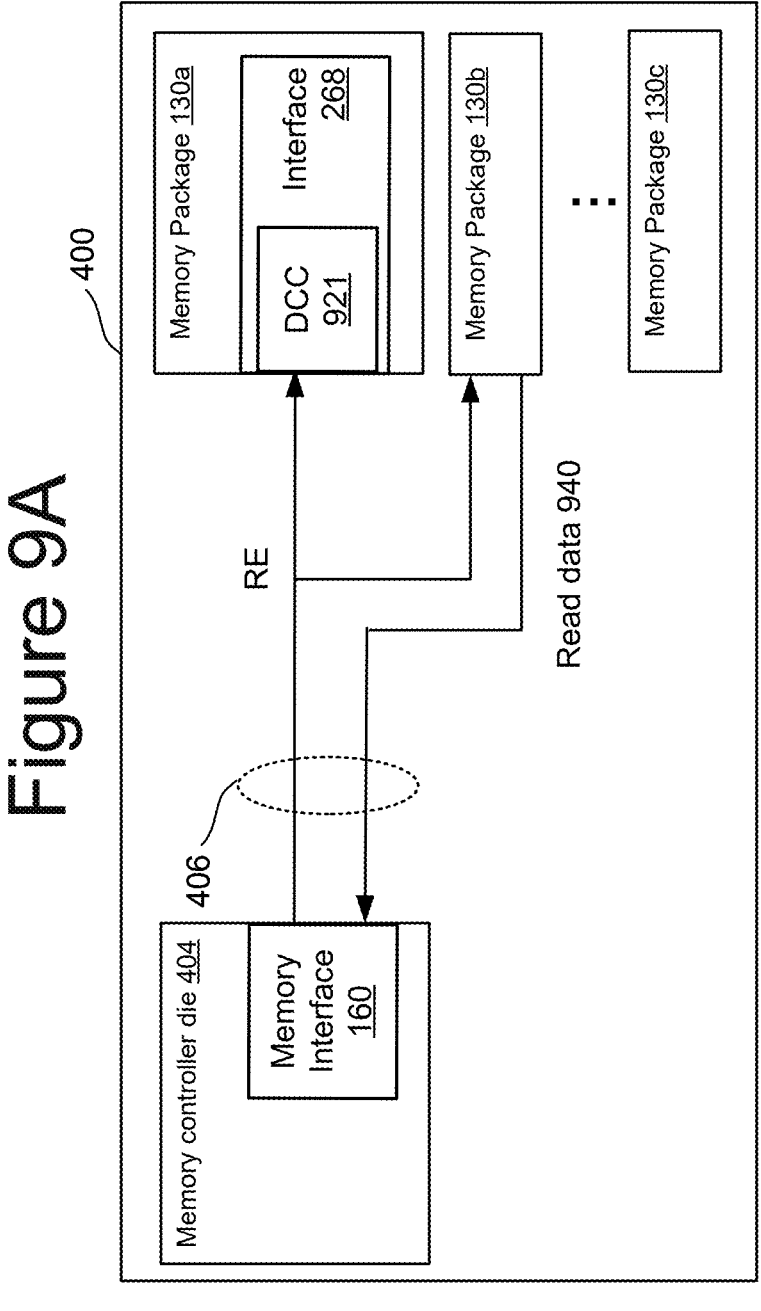
FIGS. 9A-B illustrate an example of a rapid DCC training operation.

FIG. 9A shows an example in which a quick DCC training operation is performed in memory package 130a in parallel with performing an access operation (read operation) in memory package 130b. In this example, memory package 130a is unselected while DCC training is performed as a background operation by DCC circuit 921. At the same time, memory package 130b is selected and performs a read operation that returns read data 940 over bus 406.

Figure 9B:
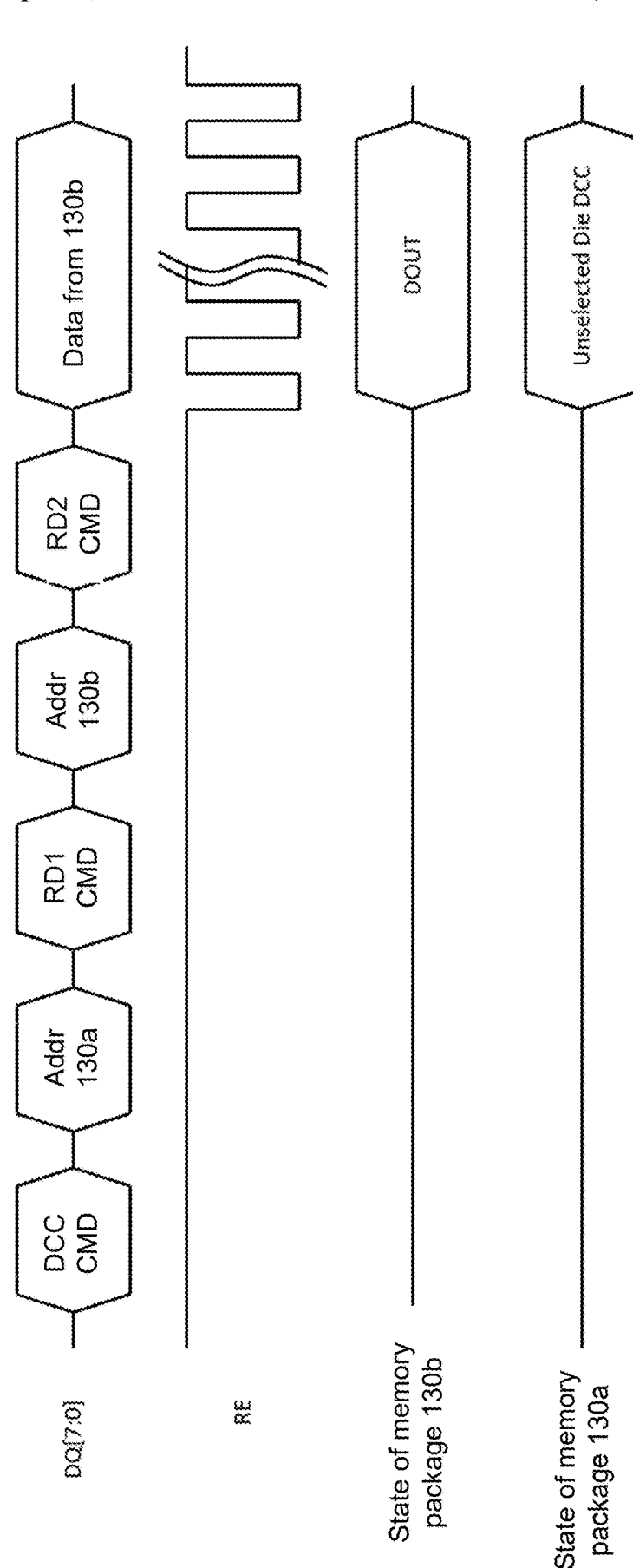

FIG. 9B further illustrates the example of FIG. 9A and includes a DCC training command (DCC CMD) sent over bus 406 (DQ[7:0] corresponds to data/command lines of bus 406) with an address in memory package 130a. This is followed by a read command (RD1 CMD and RD2 CMD) with a read address in memory package 130b, which is followed by transfer of data from memory package 130b. The state of memory package 130b is also shown as DOUT indicating that it is transferring the data indicated by the read command using clock signal RE (read enable). The state of memory package 130a during DOUT from memory package 130b shows "Unselected Die DCC" which indicates that memory package 130a is performing a DCC operation (e.g., using RE signal). Performing a DCC training operation in the manner shown in FIGS. 9A-B does not require selecting the memory package(s) where training takes place and allows another memory package to be selected to perform a memory access operation in parallel (e.g., DCC circuit 921 is configured to perform DCC training while memory package 130a is unselected). While only memory package 130a is shown performing DCC training in FIG. 9A, two or more memory packages (e.g., memory packages 130a and 130c) may perform DCC training in parallel with a memory access in this manner.

DCC circuit 921 may be considered an example of means for receiving a Duty Cycle Correction (DCC) training command over a bus (e.g., bus 406), the DCC training command directed to the first memory package (e.g., DCC CMD and Addr 130a) and performing a DCC training operation in the first memory package while the first memory package is unselected (Unselected Die DCC) and while the second memory package is selected and performs data transfer over the bus (DOUT).

In some cases, a quick DCC training may be performed in a manner that allows completion of DCC training within the minimum time for a read operation. For example, where a minimum unit of reading is 4 kB, in order to complete a quick DCC training operation as a background operation, a DCC training operation may be completed within the time for reading and transferring 4 kB. For example, in a Toggle Mode or double data rate transfer (with data transferred on rising and falling clock edges) 2048 clock cycles (4096/2) may be required to transfer 4 kB and it may be desirable to complete DCC training in fewer than 2048 clock cycles.

Figure 10:
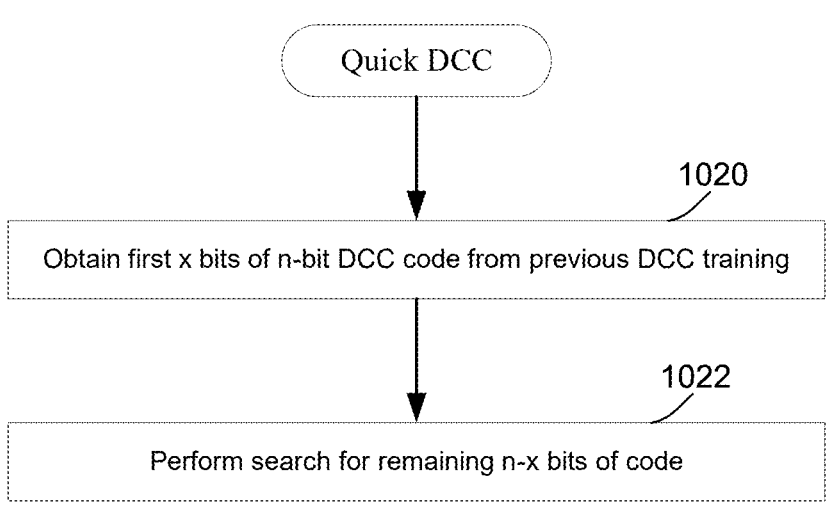
FIG. 10 illustrates an example of searching a list to obtain a delay for DCC.

In some cases, the time for a quick DCC training operation may be reduced with respect to an extended DCC training operation by simplifying searching for an appropriate delay or time offset (e.g., searching of delay list 734 may be simplified). FIG. 10 illustrates an example of searching to find an appropriate delay or offset to apply (e.g., to select an appropriate entry from delay list 734).

FIG. 10 shows an example of a simplified search that is used to find an appropriate delay at some point after initialization (e.g., after an extended DCC training has been performed). In this example, the first x bits of an n-bit code (most significant bits) are taken from the previous DCC training 1020, which may be an extended DCC training (e.g., as illustrated in 8A-B) or may be a previous quick DCC training. Because duty cycle changes are likely to be gradual and not extreme, it may be assumed that the delay to apply is in a similar range to the previous delay as indicated by the range of the x most significant bits. Accordingly, the x bits from the previous DCC training (x most significant bits of previous DCC time offset) are reused and a search (e.g., binary search, linear search or other search) is performed for only the remaining n-x lower bits 1022 (e.g., where n=7, x may be 4, so that searching is only performed for the 3 least significant bits). This means that the number of comparisons needed is fixed and may be performed in a relatively short (constant) time (e.g., within 2048 clock cycles to ensure completion in the background).

Figures 11A, 11B:
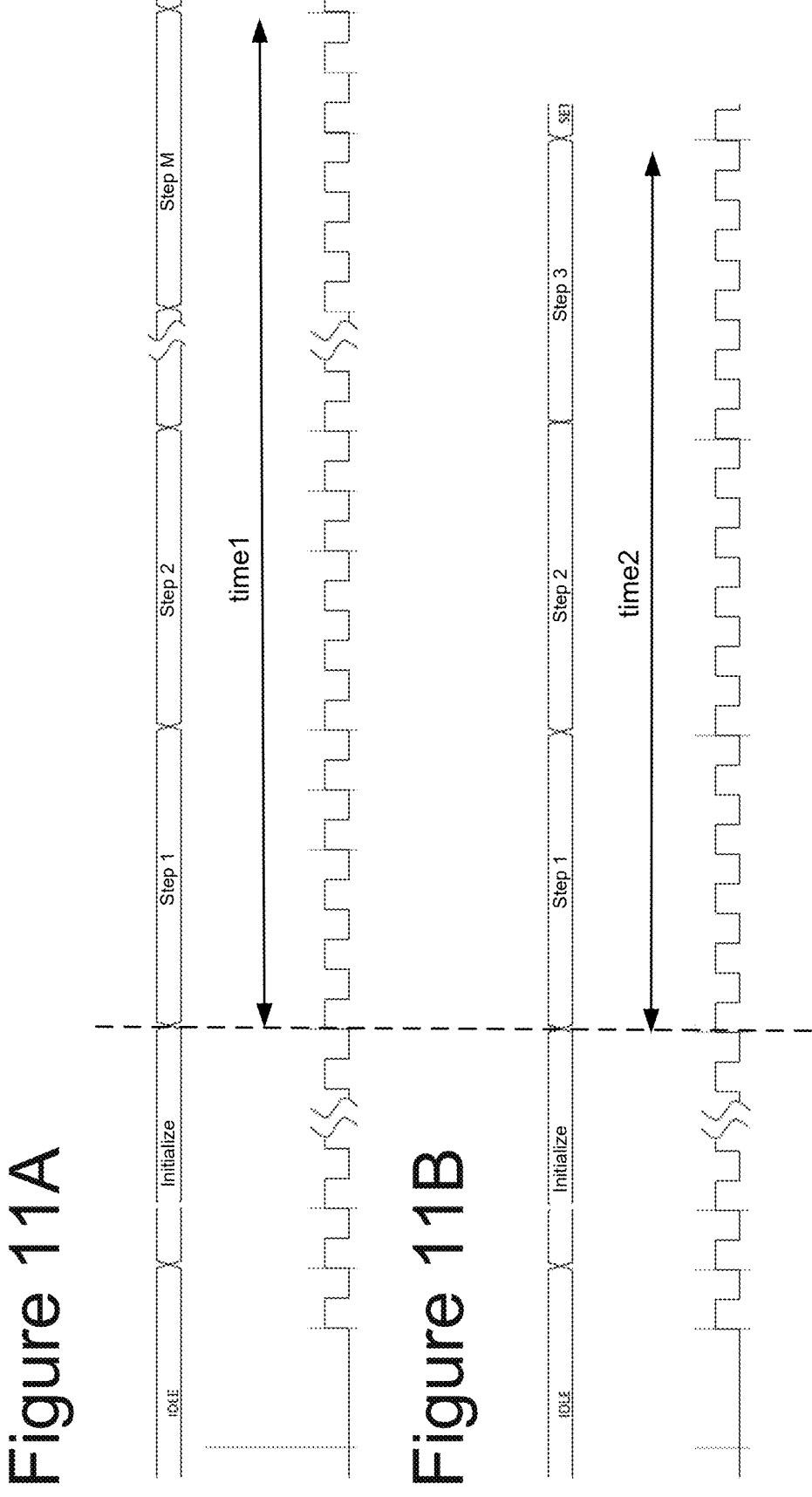
FIGS. 11A-B illustrate examples of timing of searching a list to obtain a delay for DCC.

FIGS. 11A-B show a comparison of time to obtain a delay using a binary search of an entire delay list (FIG. 11A) and using a simplified search (FIG. 11B) in which the most significant bits are obtained from a previous DCC training and binary search is only performed for the least significant bits. While binary search for n bits in FIG. 11A takes M steps (Step 1 to step M) over time1, which may vary, binary search for the least significant bits, in FIG. 11B takes three steps (Step 1 to Step 3) over time2, which may be constant and may be significantly shorter than time1 (e.g., less than half the time), which may ensure that a quick DCC training can be performed within a minimum read time (e.g., within 2048 clock cycles).

FIG. 12 shows an example of a method that includes sending a Duty Cycle Correction (DCC) training command to a first memory package 1280 (e.g., DCC CMD and Addr 130a in FIG. 9B), subsequently selecting a second memory package and sending a memory access command to the second memory package 1282 (e.g., Read CMD sequence and Addr 130b) in response to the memory access command, initiating memory access in the second memory package 1284 (e.g., to read data 940) and in parallel with the memory access in the second memory package, performing DCC training in the first memory package 1286 (e.g., unselected die DCC in FIG. 9B). While the present technology enables DCC training in a first memory package or die in parallel with memory access (e.g., read) in a second memory package or die, the present technology is not limited to such a situation and allows efficient DCC training to be performed in a first memory package with or without parallel memory access in any other memory package or die connected to the same bus.

According to a first set of aspects, an apparatus includes a control circuit located in a first memory package. The control circuit is configured to connect to a bus and to receive a Duty Cycle Correction (DCC) training command that is directed to the first memory package over the bus. The control circuit is configured to perform a DCC training operation while the first memory package is unselected and while a second memory package connected to the bus is selected.

In one or more example of the above apparatus, the one or more control circuits are further configured to receive a clock signal over the bus while the first memory package is unselected and the second memory package is selected and to use the clock signal for the DCC training while the second memory package uses the clock signal for data transfer.

In one or more example of the above apparatus, the first memory package includes a memory die and the one or more control circuits are located in the memory die.

In one or more example of the above apparatus, the first memory package is an integrated memory assembly that includes one or more nonvolatile memory die and a control die and the one or more control circuits are located in the control die.

In one or more example of the above apparatus, the apparatus includes a memory controller, the bus connecting the memory controller with the first memory package and the second memory package.

In one or more example of the above apparatus, the memory controller is configured to send the DCC training command to the first memory package and send a read command to the second memory package to cause the second memory package to perform a read operation in parallel with the DCC training operation.

In one or more example of the above apparatus, the second memory package is configured to send read data over the bus in response to the read command such that the bus is busy during the DCC training operation.

In one or more example of the above apparatus, the one or more control circuits are further configured to perform an initial DCC training operation in which data is read from the first memory package and sent over the bus while the first memory package is selected.

In one or more example of the above apparatus, the one or more control circuits are configured to perform the DCC training operation by selecting a DCC time offset from a list of DCC time offsets.

In one or more example of the above apparatus, the one or more control circuits are configured to select the DCC time offset from the list by selecting a subset of elements of the list according to a previous DCC time offset and performing a binary search of the subset of elements.

According to another set of aspects, a method includes sending a Duty Cycle Correction (DCC) training command to a first memory package via a bus; subsequently selecting a second memory package and sending a memory access command to the second memory package via the bus; in response to the memory access command, initiating memory access in the second memory package; and in parallel with the memory access in the second memory package, performing DCC training in the first memory package.

In one or more example of the above method, the memory access command is a read command and initiating memory access includes initiating reading data from a nonvolatile memory array in the second memory package and sending the data from the second memory package over the bus.

In one or more example of the above method, the method further includes receiving a clock signal in the second memory package and sending the data from the second memory package over the bus according to the clock signal while performing the DCC training in the first memory package using the clock signal.

In one or more example of the above method, performing the DCC training includes selecting a DCC time offset by searching a list of DCC time offsets.

In one or more example of the above method, searching the list of DCC time offsets includes determining a portion of the list of DCC time offsets to search from a previous DCC time offset and searching only the portion of the list.

In one or more example of the above method, the method further includes prior to sending the DCC training command, performing an initial DCC training for the first memory package, including reading data stored in the first memory package and sending the read data over the bus.

In one or more example of the above method, the list of DCC time offsets includes a multi-bit code for each DCC time offset, determining the portion of the list of DCC time offsets to search from a previous DCC time offset includes using one or more most significant bits of the multi-bit code from the initial DCC training and searching only the portion of the list includes performing a search of one or more least significant bits of multi-bit codes in the list of DCC time offsets.

In another set of aspects, a system includes a memory controller; a first memory package; a second memory package; a bus connecting the memory controller with the first and second memory packages; and means for receiving a Duty Cycle Correction (DCC) training command over the bus, the DCC training command directed to the first memory package, performing a DCC training operation in the first memory package while the first memory package is unselected and while the second memory package is selected and performs data transfer over the bus.

In one or more example of the above system, the first memory package includes a first memory die and the means for receiving the DCC training command is located in the first memory die.

In one or more example of the above system, the first memory package includes a first integrated memory assembly formed of a control die and one or more nonvolatile memory die and the means for receiving the DCC training command is located in the control die.

The foregoing detailed description has been presented for purposes of illustration and description. It is not intended to be exhaustive or to limit the invention to the precise form disclosed. Many modifications and variations are possible in light of the above teachings. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

What is claimed is:

1. An apparatus, comprising:
   one or more control circuits located in a first memory package, the one or more control circuits configured to:
      connect to a bus,
      select a first Duty Cycle Correction (DCC) offset from a plurality of DCC offsets according to results of a first DCC training operation,
      apply the first DCC offset to data received by the first memory package over the bus,
      subsequently, receive a DCC training command over the bus, the DCC training command directed to the first memory package,
      in response to receiving the DCC training command, perform a second DCC training operation while the first memory package is unselected and while a second memory package connected to the bus is selected to perform a memory access operation, wherein the second DCC training operation obtains a second DCC offset from a search of a subset of the plurality of DCC offsets and the subset is determined by the first DCC offset.

2. The apparatus of claim 1, wherein the one or more control circuits are further configured to receive a clock signal over the bus while the first memory package is unselected and the second memory package is selected and to use the clock signal for the second DCC training operation while the second memory package uses the clock signal for data transfer.

3. The apparatus of claim 1, wherein the first memory package includes a memory die and the one or more control circuits are located in the memory die.

4. The apparatus of claim 1, wherein the first memory package is an integrated memory assembly that includes one or more memory die and a control die and the one or more control circuits are located in the control die.

5. The apparatus of claim 1, further comprising:
   a memory controller, wherein the bus connects the memory controller with the first memory package and the second memory package.

6. The apparatus of claim 5, wherein the memory controller is configured to send the DCC training command to the first memory package and send a read command to the second memory package to cause the second memory package to perform a read operation in parallel with the second DCC training operation.

7. The apparatus of claim 6, wherein the second memory package is configured to send read data over the bus in response to the read command such that the bus is busy during the second DCC training operation.

8. The apparatus of claim 1, wherein the one or more control circuits are further configured to perform the first DCC training operation by reading data from the first memory package and sending the data read from the first memory package over the bus while the first memory package is selected.

9. The apparatus of claim 1, wherein the one or more control circuits are configured to perform the second DCC training operation by obtaining most significant bits of the second DCC offset from the first DCC offset.

10. The apparatus of claim 9, wherein the one or more control circuits are configured to select the second DCC offset from the subset of the plurality of DCC offsets by obtaining least significant bits of the second DCC offset from a binary search of the subset of the plurality of DCC offsets.

11. A method comprising:
   performing an initial Duty Cycle Correction (DCC) training operation for a first memory package, including reading data stored in the first memory package and sending the read data over a bus, to obtain an initial DCC time offset from a search of a list of DCC time offsets;
   subsequently, using the initial DCC time offset during a period of use of the first memory package;
   subsequently, sending a DCC training command to the first memory package via the bus;
   subsequently, selecting a second memory package and sending a memory access command to the second memory package via the bus;

in response to receiving the memory access command in the second memory package, initiating memory access in the second memory package; and in parallel with the memory access in the second memory package, performing a subsequent DCC training in the first memory package by searching a subset of the list of DCC time offsets, the subset determined by the initial DCC time offset.

12. The method of claim 11, wherein the memory access command is a read command and initiating memory access includes initiating reading data from a nonvolatile memory array in the second memory package and sending the data read from the second memory package over the bus.

13. The method of claim 11, further comprising receiving a clock signal in the second memory package and sending from the second memory package over the bus according to the clock signal while performing the subsequent DCC training in the first memory package using the clock signal.

14. The method of claim 11, wherein the initial DCC training is performed in an initialization operation in response to powering on the first memory package.

15. The method of claim 11, wherein:
the list of DCC time offsets includes a multi-bit code for each DCC time offset,
determining the subset of the list of DCC time offsets to search from the initial DCC time offset includes using one or more most significant bits of the multi-bit code for the initial DCC time offset and
searching the subset of the list of DCC time offsets includes performing a search of one or more least significant bits of the multi-bit codes in the list of DCC time offsets.

16. A system comprising:
a memory controller;
one or more unselected memory packages including at least a first memory package;
a second memory package that is selected;
a bus connecting the memory controller with the first and second memory packages; and
means for:
applying a first Duty Cycle Correction (DCC) offset from a first DCC training to data received by the first memory package over the bus,
receiving a DCC training command over the bus, the DCC training command directed to the first memory package,
performing a second DCC training operation in the first memory package while the first memory package is unselected and while the second memory package is selected and performs data transfer over the bus, wherein the second DCC training operation obtains a second DCC offset from a search of a subset of a list of DCC offsets and the subset is determined by the first DCC offset.

17. The system of claim 16, wherein the first memory package includes a first memory die and the means for receiving the DCC training command is located in the first memory die.

18. The system of claim 16, wherein the first memory package includes a first integrated memory assembly formed of a control die and one or more nonvolatile memory die and the means for receiving the DCC training command is located in the control die.

* * * * *